(12) United States Patent
Taylor

(10) Patent No.: US 7,782,625 B2
(45) Date of Patent: Aug. 24, 2010

(54) SERVER RACK BLANKING PANEL AND SYSTEM

(75) Inventor: Laurie Taylor, Ballwin, MO (US)

(73) Assignee: Compuspace LC, Chesterfield, MO (US)

( * ) Notice: Subject to any disclaimer, the term of this patent is extended or adjusted under 35 U.S.C. 154(b) by 234 days.

(21) Appl. No.: 12/229,236

(22) Filed: Aug. 20, 2008

(65) Prior Publication Data

US 2009/0059486 A1    Mar. 5, 2009

Related U.S. Application Data

(60) Provisional application No. 60/965,705, filed on Aug. 21, 2007, provisional application No. 60/998,718, filed on Oct. 12, 2007.

(51) Int. Cl.
*H05K 5/00* (2006.01)
(52) U.S. Cl. .................. 361/724; 174/66; 211/26; 211/183
(58) Field of Classification Search .......... 361/724, 361/727; 174/66, 67; 454/186; 109/58, 109/50, 23.78; 211/183, 26
See application file for complete search history.

(56) References Cited

U.S. PATENT DOCUMENTS

| | | |
|---|---|---|
| 2,352,876 A | 7/1944 | Wilson |
| 2,353,876 A | 7/1944 | Cawein |
| 2,535,876 A | 7/1944 | Cawein |
| 2,551,751 A | 5/1951 | MacDougall, Jr. |
| 2,595,408 A | 5/1952 | Quest |
| 2,868,943 A | 1/1959 | Steele |
| 2,887,733 A | 5/1959 | Kice |
| 3,078,880 A | 2/1963 | Stephens |
| 3,626,837 A | 12/1971 | Polosi, Jr. et al. |
| 3,747,503 A | 7/1973 | Lovell |
| 3,759,159 A | 9/1973 | Rachlin et al. |
| 3,972,272 A | 8/1976 | Bagby |
| 4,023,372 A | 5/1977 | Presler et al. |
| 4,103,598 A | 8/1978 | Cooper |
| 4,425,839 A | 1/1984 | Stull |
| 4,446,661 A | 5/1984 | Jonsson et al. |

(Continued)

FOREIGN PATENT DOCUMENTS

WO    2007/117714    10/2007

(Continued)

OTHER PUBLICATIONS

Published PCT Application PCT/US2008/09959, published Feb. 26, 2009.

(Continued)

*Primary Examiner*—Lisa Lea-Edmonds
(74) *Attorney, Agent, or Firm*—Harness, Dickey & Pierce, P.L.C.

(57) ABSTRACT

The present invention provides a system that allows for a single panel of the invention to be easily modified, preferably without the use of tools, to fit on a server rack, where the single panel is so modified as to cover the desired amount of open space on a server rack as a single piece, where the panel is preferably fire-rated, and where the modified panel may be easily installed onto the server rack to as to cover any open space thereon, and prevents the circular flow of warm air output from entering the cooler air input of the servers housed on the server rack.

25 Claims, 6 Drawing Sheets

U.S. PATENT DOCUMENTS

| | | | |
|---|---|---|---|
| 4,608,038 A * | 8/1986 | Virta et al. ................... 493/29 |
| 4,633,766 A | 1/1987 | Nation et al. |
| 5,271,585 A | 12/1993 | Zetena, Jr. |
| 5,316,244 A | 5/1994 | Zetena, Jr. |
| 5,341,612 A | 8/1994 | Robbins |
| 5,783,777 A * | 7/1998 | Kruse et al. ................... 174/66 |
| 5,788,414 A | 8/1998 | Gordon |
| 5,971,507 A | 10/1999 | Peroni |
| RE36,695 E * | 5/2000 | Holt ........................ 312/265.6 |
| 6,101,768 A | 8/2000 | Springstead et al. |
| 6,102,501 A * | 8/2000 | Chen et al. ............... 312/223.2 |
| 6,123,438 A | 9/2000 | Hentz |
| 6,318,113 B1 | 11/2001 | Levy et al. |
| 6,346,040 B1 | 2/2002 | Best |
| 6,347,991 B1 | 2/2002 | Bogrett et al. |
| 6,361,432 B1 | 3/2002 | Walker |
| 6,362,955 B2 | 3/2002 | Felcman et al. |
| 6,597,576 B1 * | 7/2003 | Smith et al. ................. 361/724 |
| 6,601,352 B1 | 8/2003 | Obermeyer et al. |
| 6,604,993 B1 | 8/2003 | Boniface |
| 6,616,524 B2 | 9/2003 | Storck, Jr. et al. |
| 6,672,955 B2 | 1/2004 | Charron |
| 6,711,008 B2 * | 3/2004 | Teng et al. ............. 361/679.02 |
| 6,758,353 B2 * | 7/2004 | Orr ............................. 211/183 |
| 6,822,859 B2 | 11/2004 | Coglitore et al. |
| 6,826,057 B1 * | 11/2004 | Gundogan et al. .......... 361/726 |
| 6,837,787 B2 | 1/2005 | Crook |
| 6,854,659 B2 | 2/2005 | Stahl et al. |
| 6,862,179 B2 | 3/2005 | Beitelmal et al. |
| 7,266,964 B2 | 9/2007 | Vogel et al. |
| 7,312,397 B1 * | 12/2007 | Chen et al. ..................... 174/66 |
| 7,506,768 B2 * | 3/2009 | Rassmussen et al. .......... 211/26 |
| 2001/0046123 A1 * | 11/2001 | Wedding ..................... 361/727 |
| 2004/0088928 A1 | 5/2004 | Headrick et al. |
| 2004/0232098 A1 * | 11/2004 | Orr ............................. 211/183 |
| 2005/0159099 A1 | 7/2005 | Malone |
| 2006/0081545 A1 | 4/2006 | Rassmussen et al. |
| 2007/0151177 A1 | 7/2007 | Mumaw et al. |
| 2008/0024969 A1 * | 1/2008 | Sun et al. ..................... 361/683 |
| 2010/0035535 A1 | 2/2010 | Taylor |

FOREIGN PATENT DOCUMENTS

WO   2009/025838   2/2009

OTHER PUBLICATIONS

Published PCT Application PCT/US2007/08974, published Oct. 18, 2007.

Written Opinion of International Search Authority of PCT Application PCT/US2007/08974.

International Search Report of PCT Application PCT/US2007/08974.

Sub-Zero Partitions, information from website of WDM, Inc., Redwood, California. Reference indicates Patent Pending 968803.

* cited by examiner

SERVER RACK BLANKING PANEL AND SYSTEM

STATEMENT REGARDING RELATED APPLICATIONS AND CLAIM TO PRIORITY

This application claims priority to U.S. Provisional Application 60/965,705, filed on Aug. 21, 2007, and U.S. Provisional Application 60/998,718, filed on Oct. 12, 2007. The aforementioned applications are both hereby incorporated by reference in their entirety.

STATEMENT REGARDING FEDERALLY SPONSORED RESEARCH OR DEVELOPMENT

Not applicable.

SEQUENCE LISTING, TABLE OR COMPUTER PROGRAM ON COMPACT DISC

Not applicable.

FIELD OF INVENTION

This invention relates generally to a panel and system that restricts airflow relative to computer server racks. More specifically, it relates to an assembly of at least one panel on at least one computer server rack, where the panel is scalable, meaning that it may be adjusted to conform to the open and unoccupied facial space on the server rack, so as to aid in preventing the circular flow and re-entry of high temperature air into the air intake of a server, thereby aiding in preventing the overheating of the server.

BACKGROUND OF THE INVENTION

Computer equipment and data centers have thermal cooling requirements in order to function properly. A high amount of electricity is required for one server to operate, which generates a great deal of heat within the casing of the server. This heat can cause numerous problems for the equipment, including operational failures and physical damage. In order to prevent the server from overheating, internal fans are typically integrated into the server to provide both an intake of cooler air, which may be ambient or conditioned, and an output of hot air. Most commonly, the intake of cooler air occurs at the front of the server, and the output of hot air occurs at the rear of the server. Servers are housed in server racks. When stored in server racks, the servers are all typically aligned such that the cooler air intake for all of the servers is on one side of the server rack, preferably the front of the rack, and the hot air output for all of the servers is on the other side of the server rack, preferably the rear of the rack. This arrangement of one or more servers creates an air flow from the front of the server rack to the rear of the server rack, where the flow can intensify with an increase in the number of servers, due to the BTU output or certain types of high amperage Blade servers producing high amounts of heat.

Controlling high temperatures within data centers is very difficult and complex. Yet, keeping computers and data center equipment at the right temperature is critical for the life of the equipment. Such electronic equipment must be maintained in appropriate temperature change environments subject to regulated rates of temperature change in order to maintain equipment reliability, abide by electronic equipment warranty provisions and ascertain optimum energy usage. Achieving these requirements is an ever constant and evolving concern for the data center facility manager due to the fact that computer and data processing equipment trend toward increasing the amount of power usage, and thus thermal output and cooling demand.

A problem may arise, however, when a server rack is not completely filled with servers. This empty space may permit the air intake of a server to draw the air output from the rear of the server, creating a cycle of air around and to the front of the server. Such a cycling of air does not permit cooler air to be drawn in, but instead draws in warm air that does not aid in the cooling of the server equipment, and instead can cause the server to overheat. To solve this problem, some data centers have installed panels to cover the space that would normally be covered by a face of a server. This covering blocks the circulation of warm air output into the air intake and allows whatever systems are in place within the data center to provide cooler air, such as a Computer Room Air Conditioner (CRAC), to effectively cool the servers.

Server rack-mounted equipment are typically measured against an international standard known as the Electronic Industries Alliance (EIA) standard unit, also known as a Rack Unit, or a Rack U (U). Each U is equal to 1.75 inches in height, and the height of server racks is commonly described in the art as being a certain number of U's high. Server racks may be of any height, however they are typically of a height of between 42 U to 46 U, or greater.

However, the current apparatuses for covering openings in server racks to prevent the aforementioned air circulation are inefficient and problematic. Existing panels to cover server rack spaces might have to be installed individually, with one piece to cover each 1 U empty server space. Existing panels to cover server rack spaces do not necessarily permit the use of a single panel to cover the entire unoccupied space on the rack, in that existing panels are manufactured and sold in fixed heights, which can cause the need to affix more than one panel. Panels to cover server rack spaces should be made of fire-rated material, and be able to withstand continuous duty heat associated with this use, as well substantially block air circulation. Existing means for covering server racks spaces may include the use of tools, such as drills, that can damage the material to cover the spaces, as well as be inaccurate and create additional waste or messes. Existing means for affixing the material to the server racks to cover the spaces may include tape, Velcro, magnets and other inefficient means. There is thus a need in the art for a system that can restrict airflow in the front of a server rack which is fire-rated and can be easily installed, modified and removed, and complies with standard industry server rack measurements.

SUMMARY OF THE INVENTION

The present invention meets the need in the art by providing a scalable system that allows for a single panel of the invention to be easily modified, preferably without the use of tools, to fit on a server rack, preferably a server rack that meets EIA Mounting Rail Specification EIA 310, where the single panel is so modified as to cover the desired amount of open space on a server rack, where the panel is fire-rated, and where the modified panel may be easily installed onto the server rack to as to cover the open space thereon, and prevents the circular flow of warm air output from entering the cooler air input of the servers housed on the server rack. It is within the spirit and scope of this invention for multiple panels of the invention to be used on a single server rack, which will depend on the configuration, and hence the open space of a server rack. It is an object of the present invention to provide a system that conforms to and is compatible with EIA standards.

The EIA 310 standards, which are well-known by those of ordinary skill in the art, are detailed in part in FIG. 6, which is a close up view of a portion of a server rack, showing EIA 310 standard spacing between the holes in the rack, as well as the relative location of the rack unit to the holes on a server rack. Additionally, EIA 310 standards dictate that the height of a single Rack Unit (U or RU) is 1.75 inches. EIA standards further dictate that the horizontal spacing between the two rails in a server rack are 17.75 inches, and that the horizontal spacing between two holes on opposing rails in a rack are 18.3125 inches from the center of one hole to the center of the other hole.

The system is adjustable in height, which is achieved by the separation of panel pieces along scored perforations between the pieces.

By virtue of its non-destructive mounting feature and the ease with which the panel pieces and aperture scorings are removed and separated, the system can be easily reconfigured as spatial needs change.

When installed, the system restricts airflow around servers within the racks. By restricting airflow, the system allows data centers to save electricity and costs associated with electricity usage, as well as additional costs associated with maintaining and replacing servers or server equipment due to overheating, elongating the equipment life. In many circumstances, installation of the system may lower costs associated with the purchase of one or more computer room air conditioning units. By increasing efficiency of such an air conditioning unit, the invention may lower electricity costs. The system may reduce the number of such air conditioning units required to cool a data center, when used in concert with additional air restriction or control means, such as sub-plenum or baffling. The system is removable and repositionable thereby allowing data center managers increased flexibility in arranging equipment within a data center. The system according to the present invention is constructed of material that is more flexible and easier to work with than sheet metal, fiberglass, or other materials currently known in the art. The cost of labor for installation of the system may also be less expensive than the professional installation of substitute materials, due to the ease of installation. These and other advantages and features of the present invention will become apparent from the following detailed description in conjunction with the accompanying drawings.

DETAILED DESCRIPTION OF THE INVENTION

Figure 1:
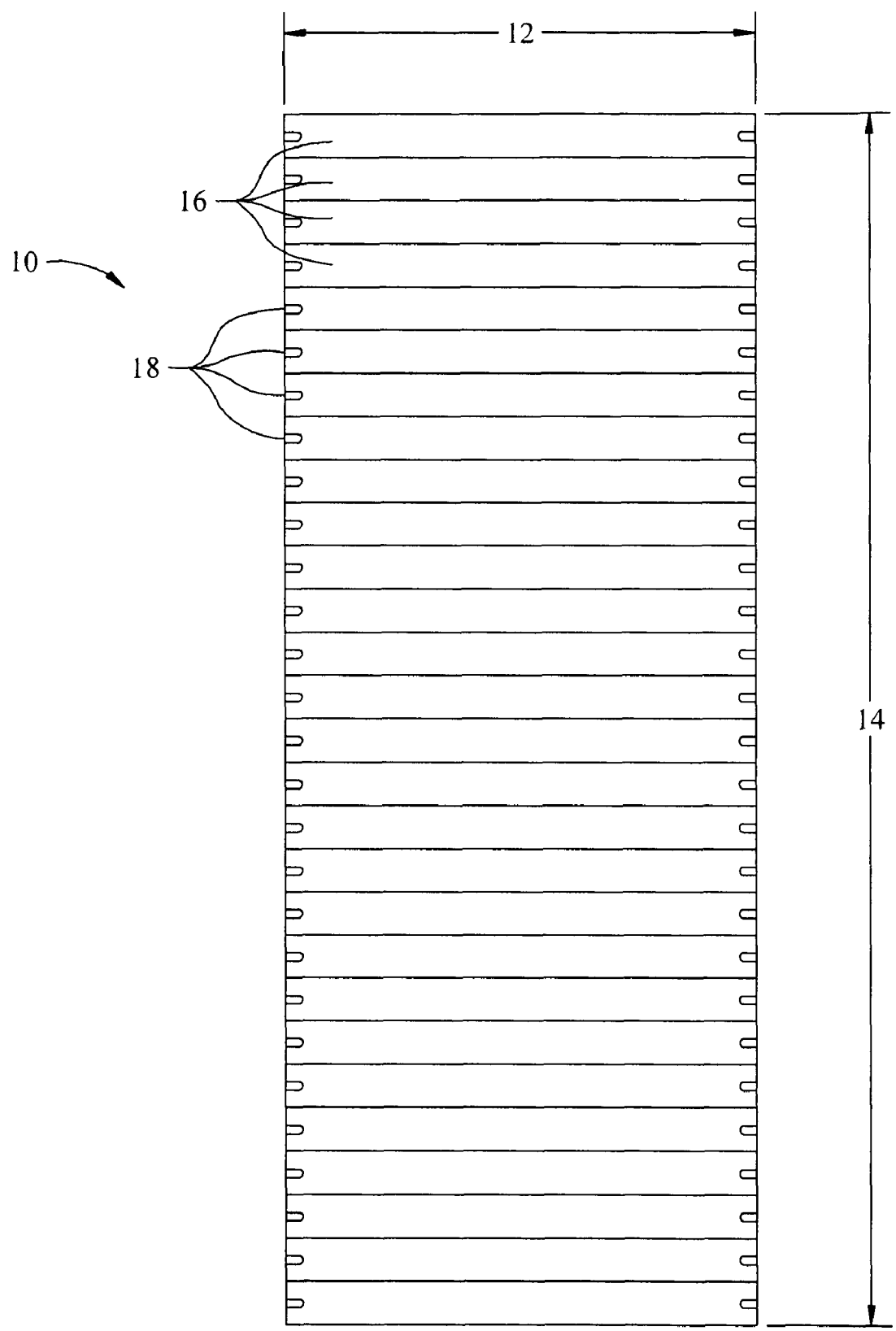
FIG. 1 is an embodiment of a full panel of the present invention.

The invention is an EIA rack enclosure blanking panel system comprised of lightweight and flexible material that may be easily modified and easily installed upon computer server racks without destructive attachment to the racks, or any additional equipment. After installation, blanking panel pieces of the system may be easily removed from the server rack. Upon removal from the server rack, the pieces may be further separated from each other and re-installed upon the server racks. In the preferred embodiment the blanking panel pieces are scored to allow for break-apart sizing and shaping. Due to their break-apart or tear-away construct the desired configuration of blanking panel pieces may be achieved with or without tools.

In an embodiment, the panel is between about 18.75 inches to about 19.50 inches wide. In a preferred embodiment, the panel is between about 19.00 inches to about 19.25 inches wide. In a particularly preferred embodiment, the panel is about 19.00 inches wide, more preferably exactly 19.00 inches wide. In another particularly preferred embodiment, the panel is about 19.25 inches wide, more preferably exactly 19.25 inches wide.

In a preferred embodiment, the panel is several U's in height, more preferably 27 U's in height or greater. In a particularly preferred embodiment, the panel is scored horizontally such that the panel is divided into equal, substantially identical separable pieces, each piece being about one U in height. In a preferred embodiment, each piece is exactly one U in height. In another embodiment of the present invention, each piece on a panel is exactly two U in height.

In another embodiment of the present invention, each piece on a panel is uniform in height throughout the panel, and the height of each piece is n U in height, where n is an integer. As an example of this embodiment, in a 27 U panel, there may be nine pieces, each piece being 3 U high. As another example of this embodiment, in a 27 U panel, there may be 27 pieces, each being 1 U high.

In another embodiment of the present invention, the pieces on a single panel are not uniform in height throughout the panel, but rather are of a of variety heights, where the height of any individual piece may be represented as y U high, where y is an integer. As an example of this embodiment, in a 27 U panel, there may be three pieces that are each 4 U high, three pieces that are each 3 U high, and three pieces that are each 2 U high. As another example of this embodiment, in a 27 U panel, there may be nine pieces that are each 2 U high, and nine pieces that are each 1 U high.

In another embodiment of the present invention, the panel comprises a single piece that is z U high, where z is an integer. As an example of this embodiment, in a 27 U panel, there is one piece that is 27 U high.

In an embodiment, the panel is further scored, in addition to the scoring between the pieces, such that, on both of the opposite horizontal ends of each piece of the panel, an aperture scoring is present. In another embodiment, the panel is further scored, in addition to the scoring between the pieces, such that, on the opposite horizontal ends of each piece of the panel, three aperture scorings are present. In a particularly preferred embodiment, the aperture scorings are present such that the panel of the present invention substantially corresponds with at least some of the rail holes of a server rack that substantially complies with EIA mounting hole locations.

In an embodiment, the panel is further scored, in addition to the scoring between the pieces, such that, on the opposite horizontal ends of each piece of the panel, at least one aperture scoring, in the shape of a circle, is present.

In an embodiment, the panel is further scored, in addition to the scoring between the pieces, such that, on the opposite horizontal ends of each piece of the panel, at least one aperture scoring, in the shape of an ellipse, is present.

In an embodiment, the panel is further scored, in addition to the scoring between the pieces, such that, on the opposite horizontal ends of each piece of the panel, at least one aperture scoring, in the shape of a rectangle, is present.

In an embodiment, the panel is further scored, in addition to the scoring between the pieces, such that, on the opposite horizontal ends of each piece of the panel, at least one aperture scoring, in the shape of a 'T' shape, is present, where a 'T shape' refers to a shape that comprises two substantially perpendicular line segments of some width greater than zero, where one line segment terminates at the midpoint of the other line segment.

In an embodiment, the panel is further scored, in addition to the scoring between the pieces, such that, on the opposite horizontal ends of each piece of the panel, at least one aperture scoring, in the shape of a half-racetrack, or a 'U' shape, is present.

In a preferred embodiment, the panel is further scored, in addition to the scoring between the pieces, such that, on the opposite horizontal ends of each piece of the panel, at least one aperture scoring, in a rounded 'T' shape, is present.

In a preferred embodiment, the panel is further scored, in addition to the scoring between the pieces, such that, on the opposite horizontal ends of each piece of the panel, at least one aperture scoring, in a rounded rectangle shape, is present.

In a more preferred embodiment, where only one aperture scoring is present on each opposite horizontal end of each piece, the aperture scoring is uniform throughout the panel, and occurs halfway up each piece vertically.

In a preferred embodiment, where a piece n U high, that piece has 2n aperture scorings, where n is an integer, and the piece has an even amount of aperture scorings on each opposite end of the piece, and the aperture scorings are evenly spaced through the opposite horizontal ends of the piece.

In an embodiment, where a piece is n U high, that piece has four aperture scorings, located substantially near the four corners of the piece.

The terms "scored" or "scoring" as used in this patent application are defined to include marks or lines created upon a surface by way of scoring, press-cutting, perforating, etching, laser cutting, knife cutting, or any other technique that results in the incomplete cutting or removal of material.

It is an embodiment of this invention, and it is understood by those of ordinary skill in the art that where the terms "scored" or "scoring" as used in this patent application in reference to the apertures, those terms also embrace as equivalents any scoring, press-cutting, perforating, etching, laser cutting, knife cutting, or any other technique that results in the complete cutting or removal of material.

In the preferred embodiment, the aperture scoring areas of the panel pieces constitute "pop-out sections." These pop-out sections may be removed by hand from the panel pieces by application of pressure applied upon the area of the panel pieces within the aperture scoring outline. In the preferred embodiment, the pressure necessary to remove the pop-out section is finger pressure. Alternatively, the pop-out section can be pressed out with a tool or can be cut out by drawing a knife-edge or sharp tool along the scored outline. Once the pop-out section is removed, a fastener-accepting aperture results in the location of the former pop-out section.

In a preferred embodiment, the panel should be of a relatively thin material. In a preferred embodiment, the panel should be of a relatively thin, fire-retardant material. In a preferred embodiment, the panel should be thin enough that it may be readily attached to a server panel through the use of mounting equipment known by those of ordinary skill in the art, such as brackets, screws, pins, pegs, bolts, hooks and other similar equipment. In a preferred embodiment, the panel may be substantially comprised of thermoplastic material, such as Acrylonitrile butadiene styrene (ABS). In another preferred embodiment, the panel may be substantially comprised of Chlorinated Polyvinyl Chloride or Chlorinated Polyvinylidine Chloride. In another preferred embodiment, the panel may be substantially comprised of Polyphenylene oxide-styrene (POS). In another preferred embodiment, the panel may be substantially comprised of plexiglass. In another preferred embodiment, the panel may be substantially comprised of high-density polyethylene (HDPE). In another preferred embodiment, the panel may be substantially comprised of any polypropylene compound.

Referring to FIG. 1, there is shown generally an embodiment of a full panel 10 of the present invention, this particular panel being about 27 U in height 14. Each piece 16 is uniform in height and width 12, and each piece has two half-racetrack shaped scoring apertures 18 on the opposite ends of the piece 16.

Figure 2:
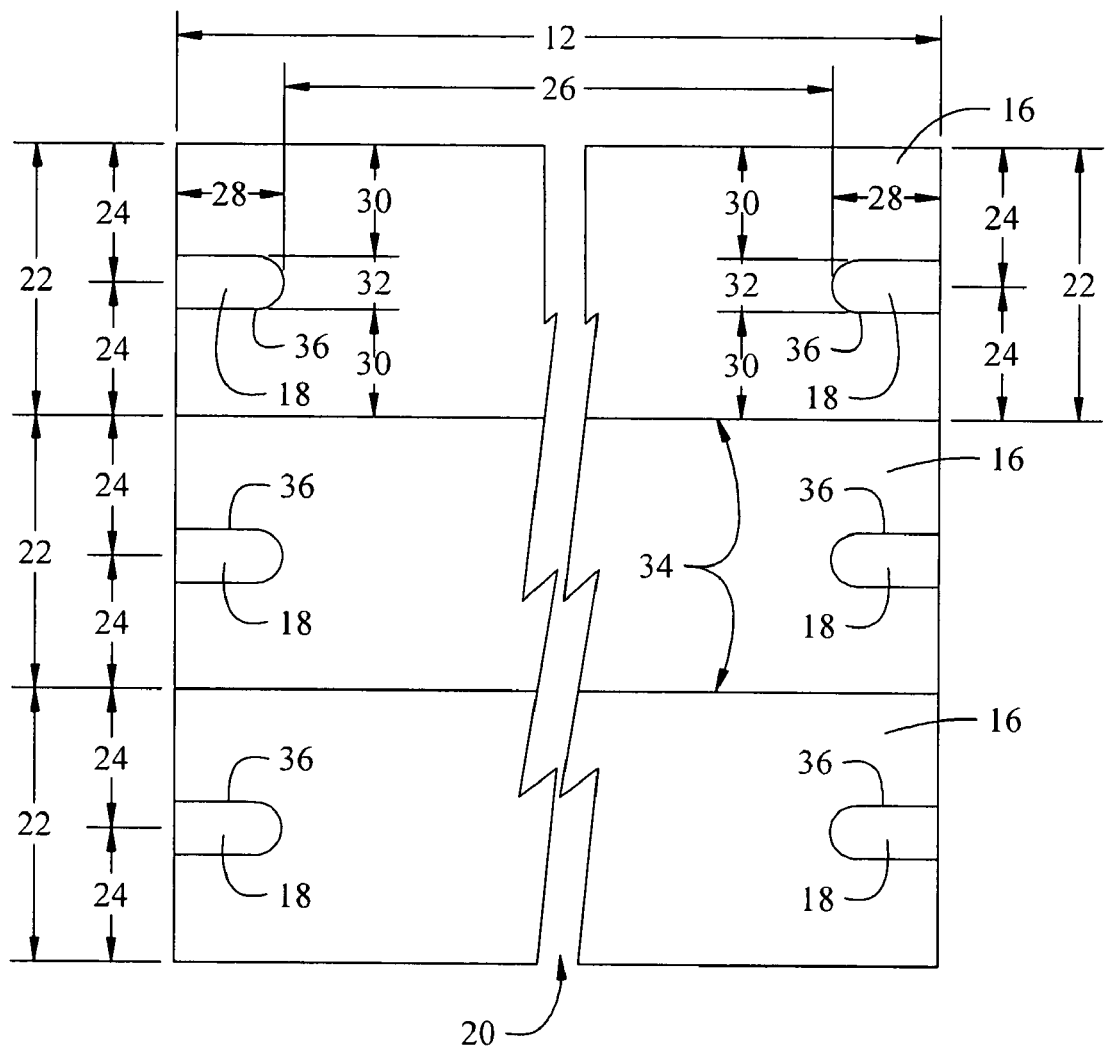
FIG. 2 is a close up view of an embodiment of three joined panel pieces, with a center break down the middle of the sections to show both ends of the sections on a single drawing.

Referring to FIG. 2, there is shown a close up view of an embodiment of three joined panel pieces 16, where a pair of jagged lines 20 represents a continuation of the pieces, which has been done to fit the figure onto one page for close inspection. Each piece is uniform in height 22 and width 12, and each piece 16 has two half-racetrack shaped scoring apertures 18 on the opposite ends of the piece 16. Each aperture 18 is located within the center of the edge of the piece on which the aperture resides, such that the measurements 30 from the each of the edges of the apertures 18 to the scored edges of the piece on which it resides are equidistant. Similarly, the center of the aperture 18 is aligned such that it is halfway down the edge of the piece 24. Each aperture is of a uniform length 28 and height 32, and in a uniform location throughout all of the pieces 16 of the panel. The apertures 18 on each piece 16 are equidistant 26 from each other throughout the panel. Each piece 16 has been scored 34 so as to permit ready separation from adjacent pieces 16. Each aperture 18 has been scored 36 so as to permit ready separation from the piece 16 on which it resides.

Figure 3:
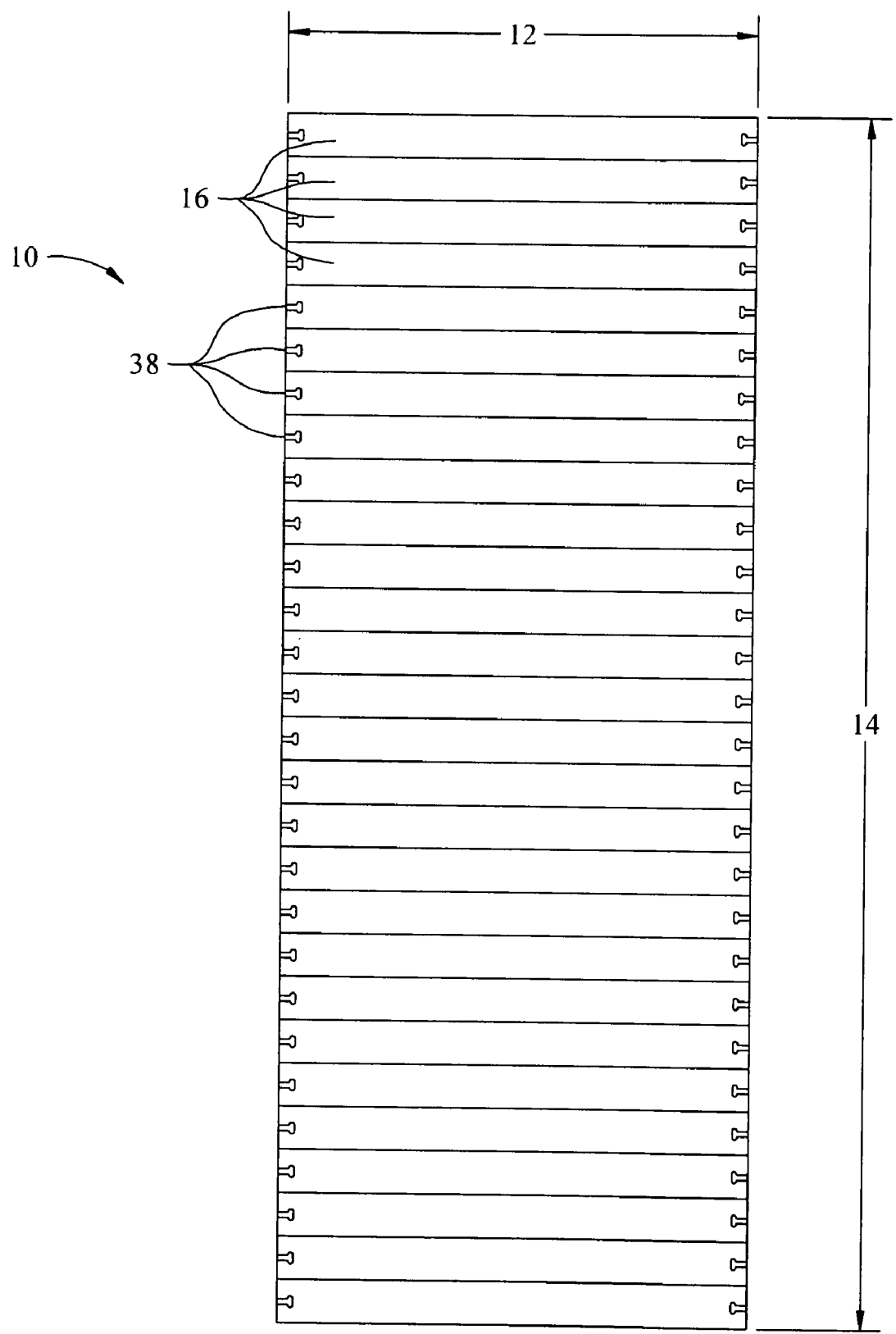
FIG. 3 is another embodiment of a full panel of the present invention.

Referring to FIG. 3, there is shown generally another embodiment of a full panel 10 of the present invention, this particular panel being about 27 U in height 14. Each piece 16 is uniform in height and width 12, and each piece has two rounded T shaped scoring apertures 38 on the opposite ends of the piece 16.

Figure 4:
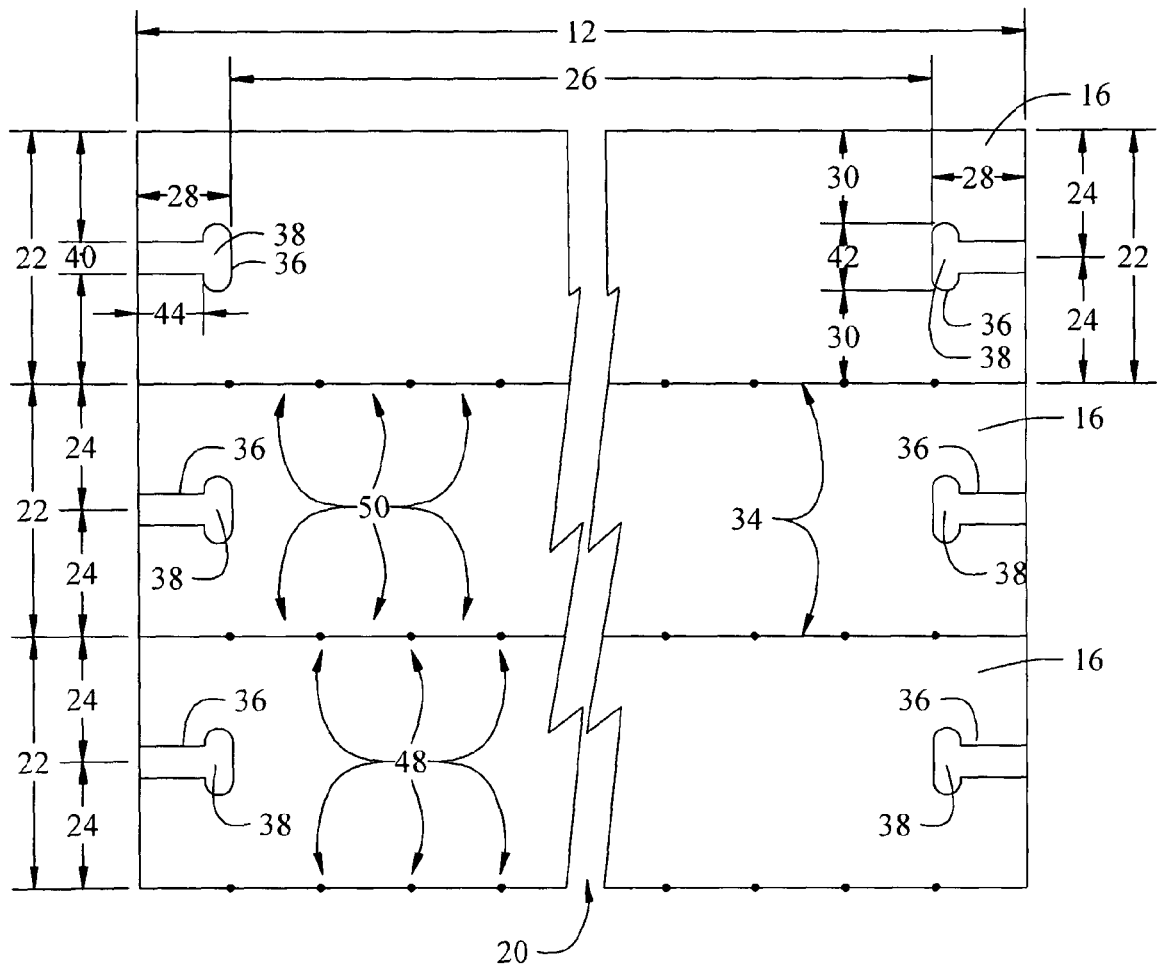
FIG. 4 is a close up view of another embodiment of three joined panel pieces, with a center break down the middle of the sections to show both ends of the sections on a single drawing.

Referring to FIG. 4, there is shown a close up view of an embodiment of three joined panel pieces 16, where a pair of jagged lines 20 represents a continuation of the pieces, which has been done to fit the figure onto one page for close inspection. Each piece is uniform in height 22 and width 12, and each piece 16 has two rounded T shaped scoring apertures 38 on the opposite ends of the piece 16. Each aperture 38 is located within the center of the edge of the piece on which the aperture resides, such that the measurements 30 from the each of the edges of the apertures 38 to the scored edges of the piece on which it resides are equidistant. Similarly, the center of the aperture 38 is aligned such that it is halfway down the edge of the piece 24. Each aperture is of a uniform length 28. Each aperture is of a uniform height, both in the narrowest height 40 and in the widest height 42. Each aperture is in a uniform location throughout all of the pieces 16 of the panel. Each aperture is of a uniform depth 44 from the edge of the piece to the widest region of the aperture. Each aperture is of a uniform depth 46 throughout the widest region of the aperture. The apertures 38 on each piece 16 are equidistant 26 from each other throughout the panel. Each piece 16 has been scored 34 so as to permit ready separation from adjacent pieces 16. Each aperture 38 has been scored 36 so as to permit ready separation from the piece 16 on which it resides. In this particular embodiment, the scoring 34 between the pieces results in nicks 48 that serve to hold the pieces 16 together until perforation. The spacing 50 between the nicks 48 is uniform in length throughout the perforations between the pieces.

Figure 5:
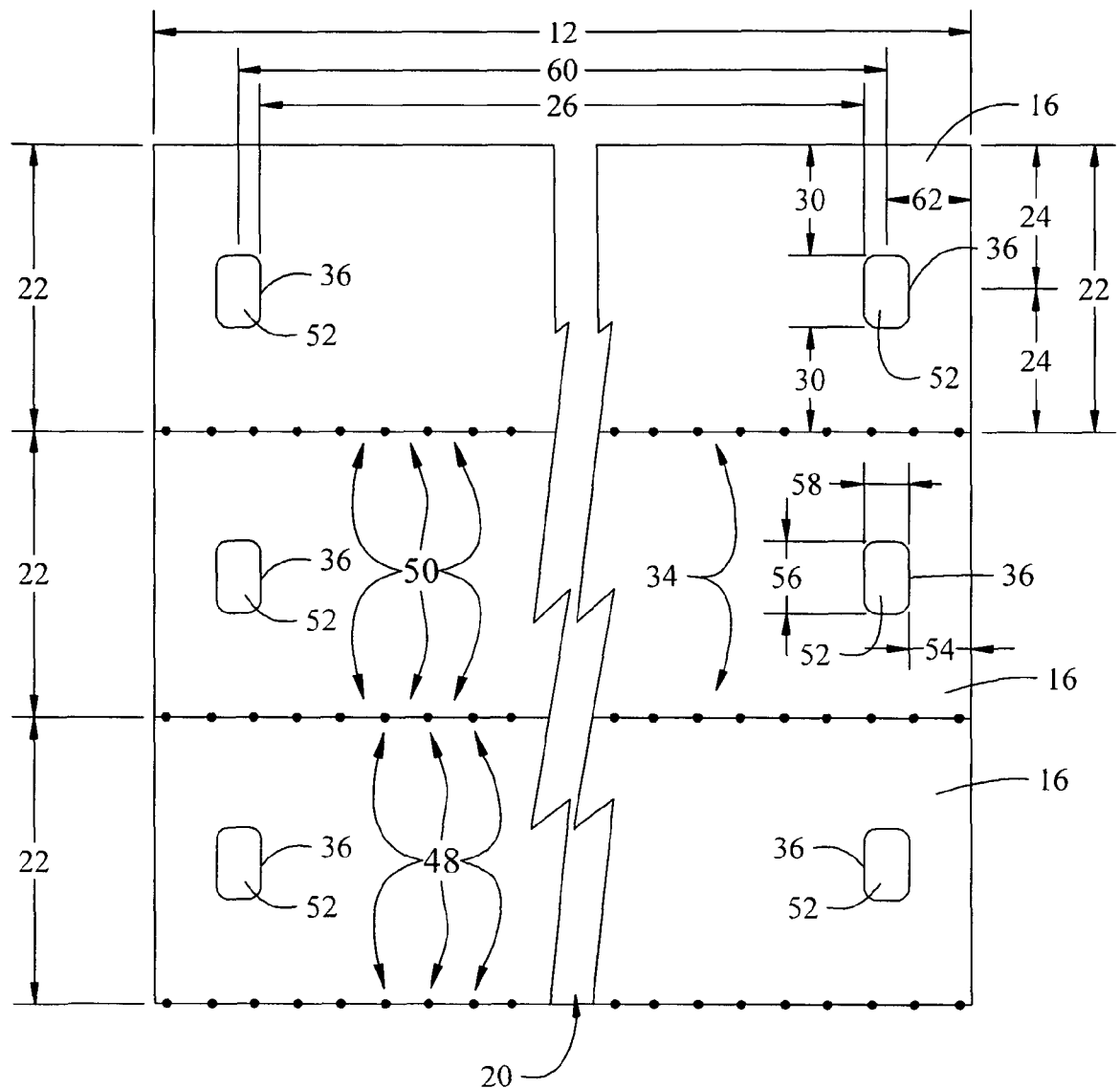
FIG. 5 is a close up view of yet another embodiment of three joined panel pieces, with a center break down the middle of the sections to show both ends of the sections on a single drawing.
Figure 6:
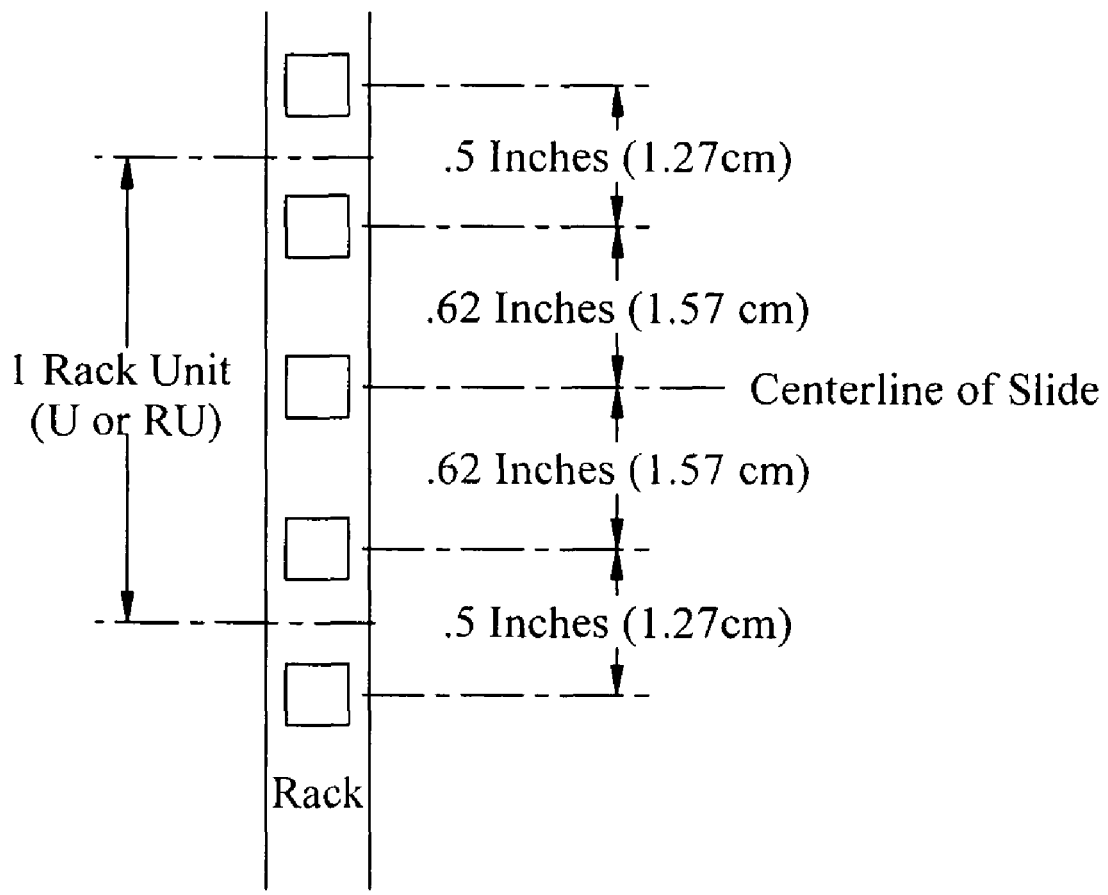
FIG. 6 is a close up view of a portion of a server rack, showing EIA 310 standard spacing between the holes in the rack, as well as the relative location of the rack unit to the holes on a server rack.

Referring to FIG. 5, there is shown a close up view of yet another embodiment of three joined panel pieces 16, where a pair of jagged lines 20 represents a continuation of the pieces, which has been done to fit the figure onto one page for close inspection. Each piece is uniform in height 22 and width 12, and each piece 16 has two rounded rectangle shaped scoring apertures 52 on the opposite ends of the piece 16. Each aperture 52 is located within the center of the edge of the piece on which the aperture resides, such that the measurements 30 from the each of the edges of the apertures 52 to the scored edges of the piece on which it resides are equidistant. Similarly, the center of the aperture 52 is aligned such that it is halfway down the edge of the piece 24. Each aperture is in a uniform location throughout all of the pieces 16 of the panel. Each aperture is located at a uniform depth 54 from the edge of the piece to the outermost edge of the aperture. Each aperture is located at a uniform depth 62 from the edge of the piece to the innermost edge of the aperture. Each aperture is of a uniform height 56. Each aperture is of a uniform width 58. The apertures 52 on each piece 16 are equidistant 26 from each other throughout the panel. The centers of the apertures 52 on each piece 16 are equidistant 60 from each other throughout the panel. Each piece 16 has been scored 34 so as to permit ready separation from adjacent pieces 16. Each aperture 52 has been scored 36 so as to permit ready separation from the piece 16 on which it resides. In this particular embodiment, the scoring 34 between the pieces results in nicks 48 that serve to hold the pieces 16 together until perforation. The spacing 50 between the nicks 48 is uniform in length throughout the perforations between the pieces.

In each embodiment herein, where scoring apertures are present, regardless of the width of the panel piece, the scoring apertures will substantially align with at least two opposing rack holes of an EIA compliant frame.

In a preferred embodiment, each panel piece has been scored on the ends of the panel piece, such that a half-racetrack shaped scoring aperture is present on each end, each aperture located substantially in the center of the respective vertical edges of the piece, each aperture being between about 0.250 to about 0.375 inches high, and being located between about 0.625 to about 0.875 inches from the vertical edge of the piece on both sides of the aperture, each aperture being about 0.6875 inches deep, measured horizontally from the edge of the piece to the furthest inside edge of the aperture.

In another preferred embodiment, each panel piece has been scored on the ends of the panel piece, such that a rounded T shaped scoring aperture is present on each end, each aperture located substantially in the center of the respective vertical edges of the piece, each aperture being between about 0.200 to about 0.375 inches high at the narrowest region and being between about 0.300 to about 0.500 inches high at the highest region. In this preferred embodiment, the apertures are located between about 0.300 to about 0.400 inches from the edge of the end of the piece to the innermost scoring of the aperture.

In yet another preferred embodiment, each panel piece has been scored on the ends of the panel piece, such that a rounded rectangle shaped scoring aperture is present on each end, each aperture located substantially in the center of the respective vertical edges of the piece, each aperture being between about 0.350 to about 0.500 inches high and being between about 0.200 to about 0.375 inches wide. In this preferred embodiment, the apertures are located between about 0.725 to about 0.775 inches from the vertical edge of the piece on both sides of the aperture. In this preferred embodiment, each aperture is about 0.6875 inches deep, measured horizontally from the edge of the piece to the furthest inside edge of the aperture.

In a preferred embodiment, the panel pieces have been scored such that between the scored pieces results are nicks that serve to hold the pieces together until perforation. The spacing between the nicks is uniform in length throughout the perforations between the pieces, and is preferably between about 0.200 to about 1.000 inches, more preferably between about 0.250 to about 0.500 inches. In this preferred embodiment, the nicks are of a uniform length throughout the perforations between the pieces, and are preferably between about 0.15625 to about 0.250 inches in length, and are preferably about 0.03125 inches in length.

In a preferred embodiment, each panel piece has been scored three times on each of the ends of the panel piece, such that a series of three scoring apertures are present on each end, each aperture located equidistant from the two most adjacent scorings, whether those scorings are for an adjacent aperture or a scoring between two panel pieces, or the edge of the panel.

In a preferred embodiment, each panel piece has been scored three times on each of the ends of the panel piece, such that a series of three half-racetrack shaped scoring apertures are present on each end, each aperture located equidistant from the two most adjacent scorings, whether those scorings are for an adjacent aperture or a scoring between two panel pieces, or the edge of the panel. In this preferred embodiment, each aperture is between about 0.250 to about 0.375 inches high, and is about 0.6875 inches deep, measured horizontally from the edge of the piece to the furthest inside edge of the aperture.

In a particularly preferred embodiment of the present invention, the system comprises a 27 U panel, where the panel is about 19.25 inches wide, and is about 47.25 inches high. In this particularly preferred embodiment, the panel has been scored such that each piece of the panel may be readily separated from the pieces directly adjacent to each piece, and has been scored so as to substantially prevent air flow through the scoring. In this particularly preferred embodiment, each panel piece has been additionally scored on the ends of the panel piece, such that a half-racetrack shaped scoring aperture is present on each end, each aperture located substantially in the center of the respective vertical edges of the piece, each aperture being about 0.250 inches high, and being located about 0.875 inches from the vertical edge of the piece on both sides of the aperture, each aperture being about 0.6875 inches deep, measured horizontally from the edge of the piece to the furthest inside edge of the aperture. In this particularly preferred embodiment, the panel has been scored such that each half-racetrack shaped scoring aperture may be readily separated from the pieces on which it resides, and has been scored so as to substantially prevent air flow through the scoring.

As used herein, and as would be understood by those of ordinary skill in the art, the term "rounded rectangle" refers to a shape that is substantially rectangular, which includes a shape that is square, where the four corners have been rounded into equal arcical segments of ninety degrees.

As used herein, and as would be understood by those of ordinary skill in the art, the term "rounded T" refers to a shape that comprises two substantially perpendicular line segments of some width greater than zero, where one line segment terminates at the midpoint of the other line segment, and where at least two corners have been rounded into equal arcical segments of ninety degrees. In an embodiment of the term "rounded T", all of the corners have been rounded into equal arcical segments of ninety degrees. In an embodiment of the term "rounded T", the two line segments are of about equal length.

The present invention additionally includes a kit, where the kit comprises at least one server rack blanking panel of the present invention and additionally mounting equipment known by those of ordinary skill in the art, such as brackets, screws, pins, pegs, bolts, hooks and other similar equipment. The mounting equipment may be readily attached to the server rack blanking panel or pre-attached thereto, and may be attached either permanently or removably.

As can be seen by the embodiments and drawings disclosed herein, the present invention permits the easy and flexible application of the invention to empty server rack space. For example, on a typical server rack that is 46 U in height, where the top ten U are empty, and where computer equipment, including potentially servers, occupy the remainder of the rack, a section of the panel may be separated such that a sub-panel of ten panel pieces is removed from the remainder of the panel along the desired scored perforations. In this example, where each panel piece has one half-racetrack shaped scoring aperture on each end, these scoring apertures on the two opposite end pieces of this sub-panel may be removed along the scored perforations of those apertures, and potentially additional apertures may be so removed as desired. In this example, the sub-panel may then be affixed to the open space of the server rack, either on the front or the back of the rack, so as to prevent air flow from the rear of the equipment on the server rack from migrating to the front of the equipment on the server rack through the server rack. In this example, the sub-panel may be so affixed in a manner known by those skilled in the art, including those disclosed herein.

While specific embodiments have been shown and described, many variations are possible. The particular shape of the segments and scored lines and markings, scoring depths and aperture outlines including all horizontal and vertical orientations, dimensions and thicknesses may be changed as desired to suit the particular server rack with which the invention is used. The material and its configuration and number of segments may vary although preferred embodiments are shown and described. The terms, descriptions and figures used herein are set forth by way of illustration only and are not meant as limitations. Those of ordinary skill in the art will recognize that many variations are possible within the scope of the invention, which is intended to be defined by the disclosure herein and their equivalents, in which all terms are meant in their broadest reasonable sense unless otherwise indicated.

I claim:
1. A server rack blanking panel comprising a panel,
   wherein the panel is between about 18.75 inches to about 19.50 inches wide, and
   wherein the panel is x U in height, where x is a whole integer, and where U is about 1.75 inches, and
   wherein the panel consists of y pieces, where y is a whole integer, and
   wherein the panel further comprises scoring, where the scoring is present on both of the opposite horizontal ends of each piece of the panel in the form of at least one aperture scoring.

2. The server rack blanking panel of claim 1, wherein the aperture scoring is a shape selected from the group consisting of a circle; an ellipse; a rectangle; a 'T' shape; a 'U' shape; a rounded 'T' shape; and, a rounded rectangle shape.

3. The server rack blanking panel of claim 1, wherein one aperture scoring is present on each opposite horizontal end of each piece, and the aperture scoring is uniform on each piece throughout the panel, and wherein the aperture scoring is present substantially halfway up each piece vertically.

4. The server rack blanking panel of claim 1, wherein x=y.

5. The server rack blanking panel of claim 1, wherein each piece is exactly one U in height.

6. The server rack blanking panel of claim 1, wherein x is a whole integer between 1 and 46 inclusive.

7. The server rack blanking panel of claim 6, wherein x is 2 or greater, and where the panel scoring further comprises horizontal scoring such that the panel is divided into equal, substantially identical separable pieces, each piece being about one U in height.

8. The server rack blanking panel of claim 1, wherein the panel is between about 19.00 inches to about 19.25 inches wide.

9. The server rack blanking panel of claim 1, wherein the panel is comprised of a lightweight and flexible material and wherein the panel is fire-retardant material.

10. The server rack blanking panel of claim 1, wherein the panel consists essentially of a material is selected from the group consisting of acrylonitrile butadiene styrene; chlorinated polyvinyl chloride; chlorinated polyvinylidine chloride; polyphenylene oxide-styrene; plexiglass; high-density polyethylene; and a polypropylene compound.

11. The server rack blanking panel of claim 1, further comprising at least one piece of n U height, where the piece has at least four aperture scorings thereon, where n is an integer.

12. The server rack blanking panel of claim 11, wherein the at least one piece of n U height comprises four aperture scorings, where the aperture scorings are located substantially near the four corners of the piece.

13. The server rack blanking panel of claim 11, wherein the at least one piece of n U height has 2n aperture scorings therein, and wherein the piece has an even amount of aperture scorings on each opposite end of the piece, and wherein the aperture scorings are evenly spaced through the opposite horizontal ends of the piece.

14. The server rack blanking panel of claim 1, wherein the aperture scoring is in the form of a rounded rectangle shaped scoring aperture, and wherein one aperture is present on each end of each piece, and wherein each aperture is located substantially in the center of the respective vertical edges of the piece, and wherein each aperture is between about 0.350 to about 0.500 inches high and between about 0.200 to about 0.375 inches wide, and wherein each aperture is located between about 0.725 to about 0.775 inches from the vertical edge of the piece, and wherein each aperture is about 0.6875 inches deep, measured horizontally from the edge of the piece to the furthest inside edge of the aperture.

15. A server rack blanking panel comprising a panel,
wherein the panel is between about 18.75 inches to about 19.50 inches wide, and
wherein the panel is x U in height, where x is a whole integer greater than one, and where U is about 1.75 inches, and
wherein the panel consists of y pieces, where y is a whole integer, and
wherein the panel further comprises scoring, where the scoring comprises horizontal scoring such that the panel is divided into equal, substantially identical separable pieces, each piece being about z U in height, where z is an integer.

16. The server rack blanking panel of claim 15, wherein z=1, and wherein x=y.

17. The server rack blanking panel of claim 15, wherein the scoring further comprises scoring on both of the opposite horizontal ends of each piece of the panel in the form of at least one aperture scoring.

18. The server rack blanking panel of claim 17, wherein the aperture scoring is a shape selected from the group consisting of a circle; an ellipse; a rectangle; a 'T' shape; a 'U' shape; a rounded 'T' shape; and, a rounded rectangle shape.

19. The server rack blanking panel of claim 17, wherein one aperture scoring is present on each opposite horizontal end of each piece, and the aperture scoring is uniform on each piece throughout the panel, and wherein the aperture scoring is present substantially halfway up each piece vertically.

20. The server rack blanking panel of claim 16, wherein x is a whole integer between 1 and 46 inclusive.

21. The server rack blanking panel of claim 15, wherein the panel is comprised of a lightweight and flexible material and wherein the panel is fire-retardant material.

22. The server rack blanking panel of claim 15, wherein the panel consists essentially of a material is selected from the group consisting of acrylonitrile butadiene styrene; chlorinated polyvinyl chloride; chlorinated polyvinylidine chloride; polyphenylene oxide-styrene; plexiglass; high-density polyethylene; and a polypropylene compound.

23. The server rack blanking panel of claim 15, wherein the aperture scoring is in the form of a rounded rectangle shaped scoring aperture, and wherein one aperture is present on each end of each piece, and wherein each aperture is located substantially in the center of the respective vertical edges of the piece, and wherein each aperture is between about 0.350 to about 0.500 inches high and between about 0.200 to about 0.375 inches wide, and wherein each aperture is located between about 0.725 to about 0.775 inches from the vertical edge of the piece, and wherein each aperture is about 0.6875 inches deep, measured horizontally from the edge of the piece to the furthest inside edge of the aperture.

24. A server rack blanking panel comprising a panel,
wherein the panel is 27 U in height, and
wherein the panel is about 19.25 inches wide, and
wherein the panel further comprises scoring such that the scoring divides the panel into 27 separable pieces of 1 U height each, and
wherein each piece comprises scoring on each of the ends of each piece in the form of a rounded rectangle shaped scoring aperture,
where each aperture is located substantially in the center of the respective vertical edges of each piece, and
where each aperture is about 0.250 inches high, is located about 0.875 inches from the vertical edge of the piece, and is about 0.6875 inches deep, measured horizontally from the edge of the piece to the furthest inside edge of the aperture.

25. A kit comprising at least one server rack blanking panel of claim 1 and at least one piece of mounting equipment, where the at least one piece of mounting equipment is selected from the group consisting of brackets; screws; pins; pegs; bolts; and, hooks.

* * * * *

UNITED STATES PATENT AND TRADEMARK OFFICE
CERTIFICATE OF CORRECTION

PATENT NO.        : 7,782,625 B2  
APPLICATION NO.   : 12/229236  
DATED             : August 24, 2010  
INVENTOR(S)       : Laurie Taylor Page 1 of 1

It is certified that error appears in the above-identified patent and that said Letters Patent is hereby corrected as shown below:

At column 4, line 46, replace "of variety heights" with "variety of heights".

At column 10, in claim 10, line 39, replace "material is selected" with "material selected".

At column 11, in claim 22, line 37, replace "material is selected" with "material selected".

Signed and Sealed this  
Twenty-fifth Day of January, 2011

David J. Kappos  
*Director of the United States Patent and Trademark Office*